(12) United States Patent
Coffy et al.

(10) Patent No.: US 9,502,361 B2
(45) Date of Patent: Nov. 22, 2016

(54) ELECTRONIC DEVICE WITH STACKED CHIPS

(71) Applicant: STMicroelectronics (Grenoble 2) SAS, Grenoble (FR)

(72) Inventors: Romain Coffy, Voiron (FR); Julien Pruvost, Voiron (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/852,711

(22) Filed: Sep. 14, 2015

(65) Prior Publication Data

US 2016/0148880 A1 May 26, 2016

(30) Foreign Application Priority Data

Nov. 21, 2014 (FR) ...................... 14 61285

(51) Int. Cl.
*H01L 23/488* (2006.01)
*H01L 23/00* (2006.01)
(Continued)

(52) U.S. Cl.
CPC ............ *H01L 23/562* (2013.01); *B81C 3/001* (2013.01); *H01L 21/4853* (2013.01); *H01L 21/563* (2013.01); *H01L 23/14* (2013.01); *H01L 23/315* (2013.01); *H01L 23/3114* (2013.01); *H01L 23/3157* (2013.01); *H01L 23/49811* (2013.01); *H01L 23/49838* (2013.01); *H01L 24/97* (2013.01); *H01L 25/0657* (2013.01); *H01L 25/50* (2013.01); *B81B 2207/098* (2013.01); *B81C 2201/0174* (2013.01); *B81C 2203/0771* (2013.01); *H01L 2224/16225* (2013.01); *H01L 2225/06513* (2013.01); *H01L 2225/06555* (2013.01); *H01L 2924/15311* (2013.01); *H01L 2924/18161* (2013.01)

(58) Field of Classification Search
CPC H01L 25/0657; H01L 21/563; H01L 23/315
USPC .......................................... 257/773
See application file for complete search history.

(56) References Cited

U.S. PATENT DOCUMENTS 6,020,219 A 2/2000 Dudderar et al.
6,544,371 B2 4/2003 Senoo et al.
(Continued)

FOREIGN PATENT DOCUMENTS

EP 1596438 A2 11/2005
JP 2011114054 A 6/2011
WO WO-2010109703 A1 9/2010

OTHER PUBLICATIONS

INPI Search Report and Written Opinion for FR 1461285 mailed Sep. 17, 2015 (7 pages).

*Primary Examiner* — Andy Huynh
*Assistant Examiner* — Sitaramarao S Yechuri
(74) *Attorney, Agent, or Firm* — Gardere Wynne Sewell LLP

(57) ABSTRACT

An electronic device includes a first and a second integrated-circuit chip that are stacked at a distance from one another, and a plurality of electrical connection pillars and at least one protective barrier interposed between the chips. The protective barrier delimits a free space between mutually opposing local regions of the chips, and an encapsulation block extends around the chip that has the smaller mounting face and over the periphery of the mounting face of the other chip. The electrical connection pillars and the protective barrier are made of at least one identical metallic material with a view to simultaneous fabrication.

13 Claims, 5 Drawing Sheets

(51) Int. Cl.
*B81C 3/00* (2006.01)
*H01L 23/31* (2006.01)
*H01L 25/065* (2006.01)
*H01L 21/48* (2006.01)
*H01L 21/56* (2006.01)
*H01L 23/14* (2006.01)
*H01L 23/498* (2006.01)
*H01L 25/00* (2006.01)

(56) References Cited

U.S. PATENT DOCUMENTS

| | | | |
|---|---|---|---|
| 7,675,180 | B1 | 3/2010 | St. Amand et al. |
| 2003/0098912 | A1 | 5/2003 | Hosokai et al. |
| 2006/0043555 | A1 | 3/2006 | Liu |
| 2006/0100299 | A1 | 5/2006 | Malik et al. |
| 2007/0080467 | A1* | 4/2007 | Kurita .............. H01L 23/3114 257/777 |
| 2008/0023809 | A1 | 1/2008 | Wu et al. |
| 2008/0217772 | A1* | 9/2008 | Watanabe .......... H01L 23/3114 257/737 |
| 2008/0296718 | A1 | 12/2008 | Kumata et al. |
| 2009/0213262 | A1 | 8/2009 | Singh et al. |
| 2009/0267170 | A1 | 10/2009 | Chien et al. |
| 2011/0180893 | A1 | 7/2011 | Minegishi et al. |
| 2011/0227173 | A1* | 9/2011 | Seppala ................ B81C 1/0023 257/415 |
| 2012/0147489 | A1 | 6/2012 | Matsuoka |
| 2012/0159118 | A1* | 6/2012 | Wong .................... H01L 25/105 712/1 |
| 2015/0070864 | A1 | 3/2015 | Rainer et al. |
| 2015/0364455 | A1 | 12/2015 | Crobu et al. |

* cited by examiner

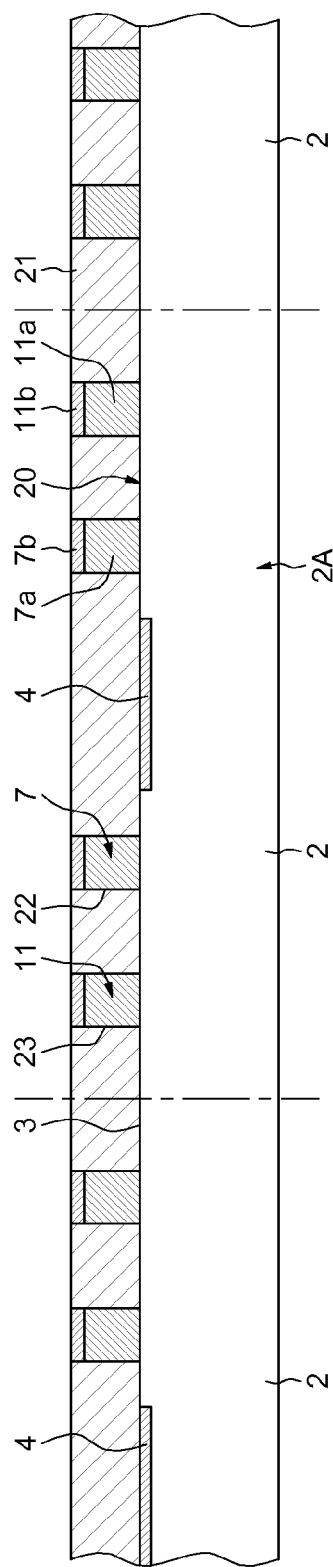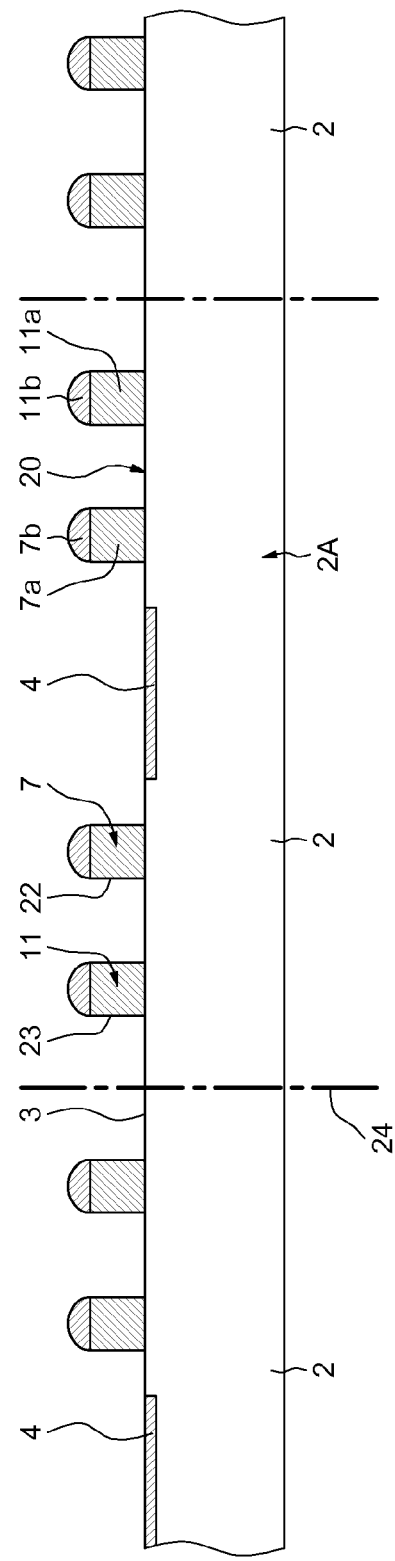

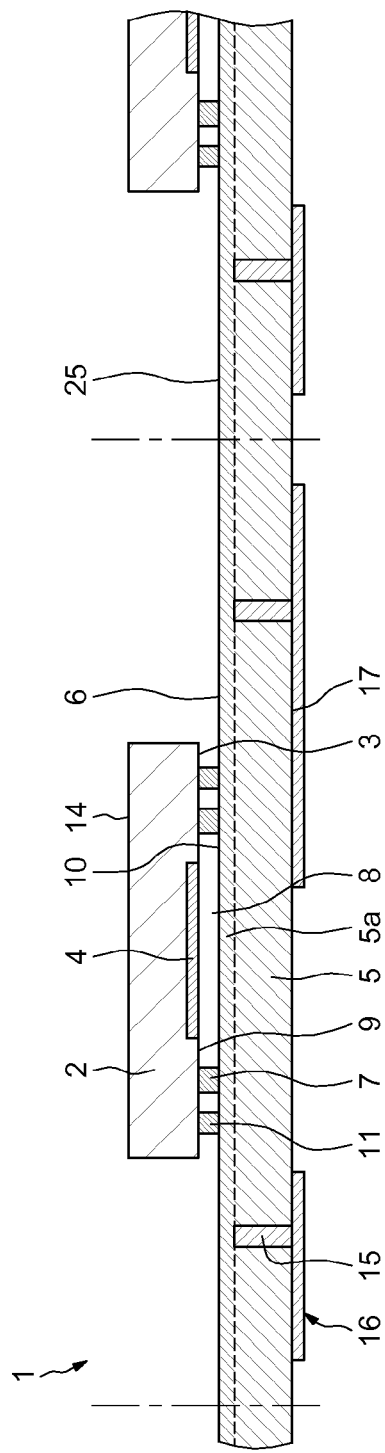
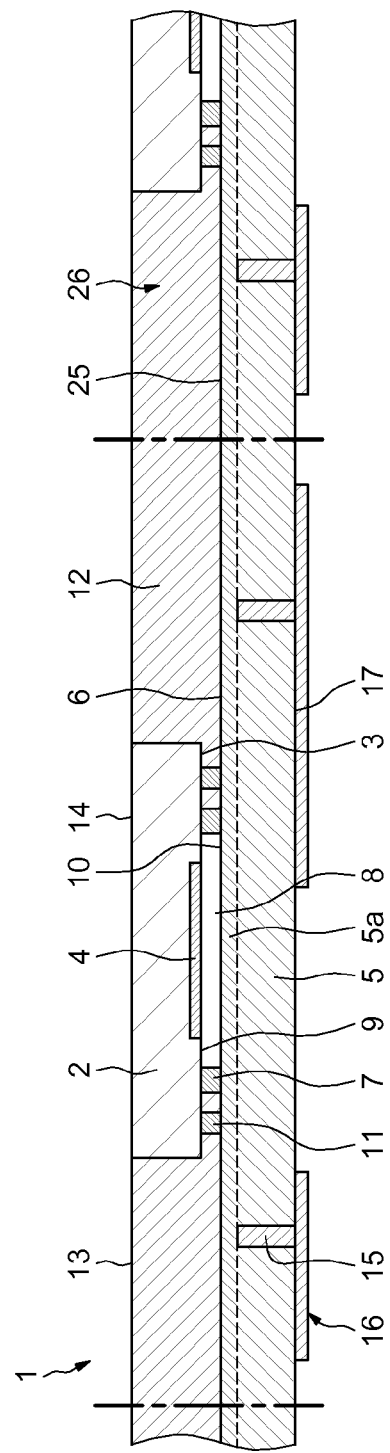

ELECTRONIC DEVICE WITH STACKED CHIPS

PRIORITY CLAIM

This application claims the priority benefit of French Patent Application No. 1461285, filed on Nov. 21, 2014, the contents of which is hereby incorporated by reference in its entirety to the maximum extent allowable by law.

TECHNICAL FIELD

The present invention relates to the field of electronic devices, which include integrated-circuit chips stacked on one another.

BACKGROUND

According to one known embodiment, an electronic device comprises a stack consisting of a first chip bonded onto a second chip with larger dimensions, and an electrical connection wafer onto which the second chip is bonded and which has larger dimensions than this second chip.

Front pads of the first chip are connected to front pads of the second chip by first curved electrical connection wires.

Other front pads of the second chip are connected to front pads of the electrical connection wafer by second curved electrical connection wires.

Commonly, the first chip contains a sensor, for example a microelectromechanical system, generally referred to as MEMS, and the second chip contains electronic circuits for processing the signals coming from the sensor, and the processed signals are transmitted to the printed-circuit board through the electrical connection wafer.

The first and second chips and the first and second electrical connection wires are embedded in an encapsulation block formed on the front of the electrical connection wafer with a view to protecting the electrical connection wires and the sensor, in particular from moisture.

The electronic device is then fixed on a printed-circuit board by means of electrical connection beads or pillars.

Such an electronic device has the drawback of being bulky and of being expensive because of the existence of three stacked elements, the existence of electrical connection wires generally made of gold, and the large number of operations to be carried out in order to perform assembly.

There is a need in the art for an electronic device which has a smaller volume and is simpler to fabricate, so that it can be less expensive.

SUMMARY

One embodiment provides a method for fabricating at least one electronic device that includes a first and a second integrated-circuit chip stacked on one another.

This method includes simultaneously producing, on mounting zones of a mounting face of a first chip by growth or electrodeposition of at least one metal, a plurality of metal electrical connection pillars and at least one protective metal barrier, surrounding a region of the mounting face. A second chip is placed above the first chip in a position such that a mounting face of this second chip faces the mounting face of the first chip, and the ends of the electrical connection pillars and of the protective barrier come into contact with mounting zones of the second chip. The ends of the electrical connection pillars and of the protective barrier are secured by soldering to the mounting zones of the second chip, so that this protective barrier delimits a leaktight free space between the chips. A coating material is added around the chip that has the smaller mounting face and on the periphery of the mounting face of the other chip, and this coating material is cured so as to produce an encapsulation block.

The method may include producing the protective barrier at least partially in the form of at least one closed ring.

The method may include producing the protective barrier at least partially in the form of at least one open ring.

The method may include producing the protective barrier at least partially in the form of pillars at a distance from one another.

The method may include producing the encapsulation block so that the latter reaches the protective barrier.

Another embodiment provides an electronic device that includes a first and a second integrated-circuit chip stacked on one another where mounting faces are oriented toward and disposed at a distance from one another. A plurality of electrical connection pillars and at least one protective barrier are interposed between the mounting faces of the chips and are secured to the latter such that they delimit a free space between mutually opposing local regions of the mounting faces. An encapsulation block extends around the chip that has the smaller mounting face and over the periphery of the mounting face of the other chip, and the electrical connection pillars and the protective barrier are made of at least one identical metallic material.

The protective barrier may at least partially include at least one closed ring.

The protective barrier may at least partially include at least one open ring.

The protective barrier may at least partially include pillars at a distance from one another.

One of the chips may include a sensor and the other chip may comprise an electronic circuit for processing the signal delivered by this sensor.

BRIEF DESCRIPTION OF THE DRAWINGS

Electronic devices will now be described by way of nonlimiting example illustrated by the drawings, in which:

FIGS. 3 and 4 represent cross sections of an assembly corresponding to fabrication steps of the electronic device;

FIGS. 5 and 6 represent cross sections of an assembly corresponding to other fabrication steps of the electronic device.

DETAILED DESCRIPTION

Figure 1:
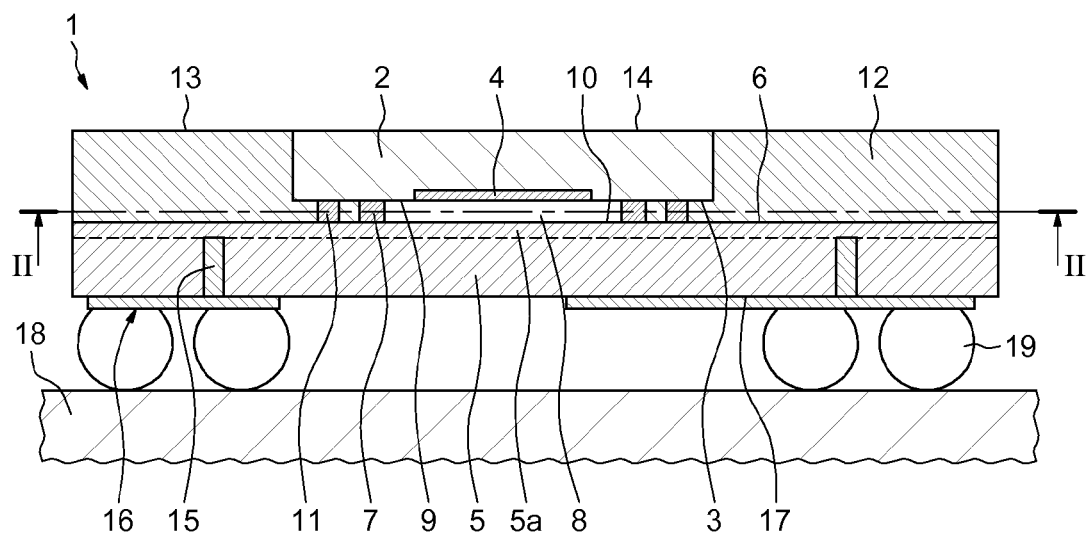
FIG. 1 represents a cross section of an electronic device with two chips.
Figure 2:
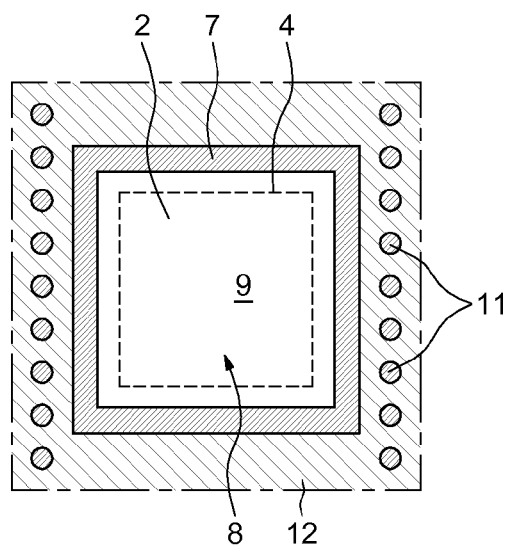
FIG. 2 represents a plan section of the electronic device passing between the chips, along II-II of FIG. 1.

As illustrated in FIGS. 1 and 2, an electronic device 1 comprises a first integrated-circuit chip 2, which has, for example, a square-shaped mounting face 3 and contains a sensor 4 below the central part of this mounting face 3, for example a microelectromechanical system, generally referred to as MEMS.

The electronic device 1 comprises a second integrated-circuit chip 5, which has, for example, a square-shaped mounting face 6 and contains an integrated electronic circuit 5a below this mounting face 6. The surface area of the mounting face 3 of the chip 2 is smaller than the surface area of the mounting face 6 of the chip 5.

The chips 2 and 5 are stacked on one another in a position such that the mounting faces 3 and 6 are oriented toward one another and parallel at a distance from one another, the chip 2 being within, for example in the middle of, the chip 5 and their peripheral edges respectively being arranged parallel.

The electronic device 1 comprises a protective metal barrier in the form of a closed protective ring 7 interposed between local mounting zones of the mounting faces 3 and 6 and secured to these local zones, surrounding mutually opposing local regions 9 and 10 of the mounting faces 3 and 6 of the chips 2 and 5, and delimiting a leaktight free space 8 between these local regions.

The protective ring 7 extends for example in the form of a square, the sides of which are parallel to the peripheral edges of the chips 2 and 5. The sensor 4 is included in the local region 9 of the chip 2, at a distance from the protective ring 7.

The electronic device 1 comprises a plurality of metal electrical connection pillars 11, which are interposed between the mounting faces 3 and 6 and are secured to the latter, and which are located outside the protective ring 7, that is to say between and at a distance from this protective ring 7 and the peripheral edges of the chip 2. For example, metal electrical connection elements 11 are provided on two parallel opposite lines lying along two opposite parallel branches of the protective ring 7.

The electrical connection pillars 11 are arranged on local mounting zones that include electrical connection pads and of the faces 3 and 6 of the chips 2 and 5.

The electronic device 1 furthermore comprises an encapsulation block 12, for example made of an epoxy resin, which is formed on the peripheral part of the mounting face 6 of the chip 5 so as to surround the chip 2, and which extends between the mounting faces 3 and 6 of the chips 2 and 5 while passing between the electrical connection pillars 11 and as far as the protective ring 7. By virtue of this protective ring 7, the material of the encapsulation block 12 does not reach the free space 8, so that the latter is protected in particular against moisture and against any ingress of solid particles, and so that the sensor 4 is therefore protected.

The thickness of the encapsulation block 12 is such that the latter has an outer face 13 that extends in the same plane as the outer face 14 of the chip 2 opposite and parallel to its mounting face 3.

The peripheral sides of the chip 5 and of the encapsulation block 12 are aligned and extend perpendicularly to the mounting faces 6, so that the electronic device 1 is in the shape of a parallelepiped.

The chip 5 has a plurality of metal electrical connection vias 15, which connect the integrated electronic circuit 5a and a connection network 16 arranged on the outer face 17 of the chip 5, on the opposite side from its mounting face 6.

The electronic device 1 may be mounted on a printed-circuit board 18 by means of connection elements 19, such as beads or electrical connection pillars, interposed between this printed-circuit board 18 and the electrical connection network 16.

From the point of view of electronics, selectively by means of the electrical connection pillars 11, the metal electrical connection vias 15 and the electrical connection beads 19, the sensor 4 and the electronic circuit 5a can be supplied with electrical energy and the signals coming from the sensor 4 can be at least in part processed by the electronic circuit 5a in order to be delivered to the printed-circuit board 18.

Referring to FIGS. 3 to 6, a way of fabricating the electronic device 1 will now be described.

As illustrated in FIG. 3, with a view to collective fabrication, a panel 2A is provided, which comprises a plurality of first chips 2 adjacent to one another in the form of a matrix and has a face 20 including the mounting faces 3 of these chips 2, at locations on which the protective metal ring 7 and the corresponding metal electrical connection pillars 11 will be produced simultaneously by employing the means used in microelectronics.

A mask 21 is formed on the face 20, and through-openings 22 corresponding to the protective rings 7 to be produced and through-openings 23 corresponding to the electrical connection elements 11 to be produced on the corresponding local zones are formed through this mask 21 in each location.

Then, in particular base portions 7a and 11a of the protective metal rings 7 and of the metal electrical connection pillars 11 are produced simultaneously through the openings 22 and 23 by growth deposition or electrodeposition in suitable baths, for example from copper, followed by end portions 7b and 11b from a soldering material, for example an alloy of tin and silver. Intermediate layers may be provided in order to facilitate connection and to constitute diffusion barriers.

Next, as illustrated in FIG. 4, the mask 21 is removed. The panel 2A is then passed through an oven so that the end portions 7b and 11b assume the shape of domes.

The chips 2 are then divided up by sawing the panel 2A along the lines 24 of the matrix of corresponding locations.

As illustrated in FIG. 5, with a view to collective fabrication, a panel 5A is provided, which comprises a plurality of second chips 5 adjacent to one another in the form of a matrix and has a face 25 including the mounting faces 6 of these chips 5, in locations on which the chips 2 produced beforehand will be mounted.

By transfer, chips 2 are respectively placed on these locations in the position described with reference to FIG. 1. Simultaneous soldering of the base portions 7a and 11a onto the corresponding zones of the chips 5 is then carried out in an oven using solder end portions 7b and 11b.

A common layer 26 of a liquid encapsulation material which is intended for fabricating encapsulation blocks 12 in the corresponding locations, and which fills the spaces between the transferred and soldered chips 2, is then applied and spread, this material flowing by capillary action between the electrical connection pillars 11 and being prevented from reaching the free spaces 8 because of the existence of the protective rings 7. According to an alternative embodiment, the common layer 26 could be obtained by injecting a liquid encapsulation material into the remaining space of the cavity of a mold, delimited by a mold plate in contact with the faces 14 of the chips 2, then curing this encapsulation material.

The common layer 26 is then cured in an oven. Next, the electrical connection beads 19 are placed in each of the locations.

The electronic devices 1 obtained in each location are finally divided up by sawing the panel 2A and the layer 26 along the lines 27 of the matrix of corresponding locations.

Figure 7:
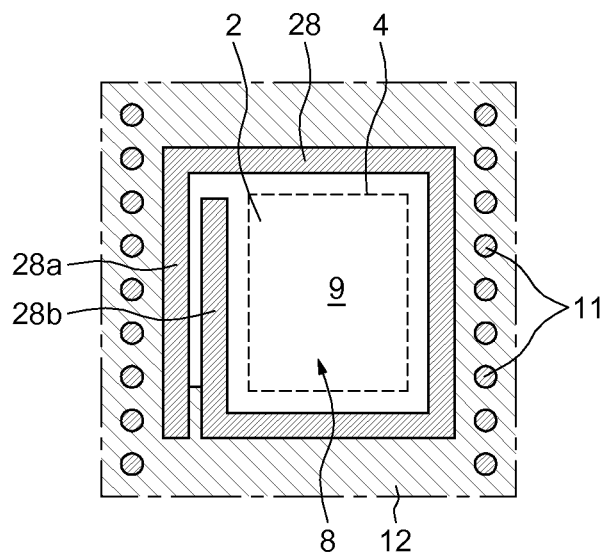
FIGS. 7-9 represent plan sections of alternative embodiments of the electronic device.

According to an alternative embodiment illustrated in FIG. 7, the closed protective ring 7 constituting a protective barrier may be replaced with a continuous open protective ring 28 having end portions 28a and 28b extending next to (i.e. overlapping) one another.

The distance between these end portions 28a and 28b is such that, during the aforementioned formation of the layer 26 of a liquid encapsulation material, this material, if it penetrates between these portions 28a and 28b, does not reach the free space 8.

Figure 8:
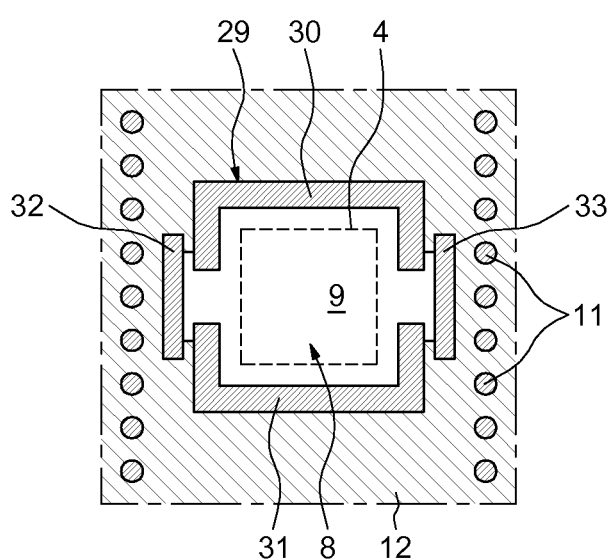

According to an alternative embodiment illustrated in FIG. 8, a protective barrier may consist of a discontinuous open protective ring 29. This protective ring 29 comprises two portions 30 and 31, which extend in a C-shape, are symmetrical and are open toward one another, and straight portions 32 and 33 extending in front of the spaces separating the ends of the branches of the portions 30 and 31 and overlapping the ends.

The distance between the branches of the portions 30 and 31 and the straight portions 32 and 33 is such that, during the aforementioned formation of the layer 26 of a liquid encapsulation material, this material, if it penetrates between these portions, does not reach the free space 8.

Figure 9:
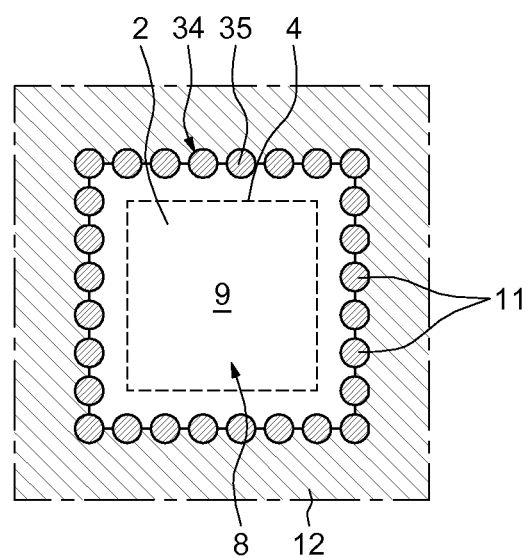

According to an alternative embodiment illustrated in FIG. 9, a protective barrier may consist of a discontinuous protective ring which, this time, comprises a plurality of spaced metal pillars 34, of which some consist of the metal electrical connection pillars 11 and the others consist of metal pillars 35 not electrically connected.

The distance between the metal pillars 34 is such that, during the aforementioned formation of the layer 26 of a liquid encapsulation material, this material, if it penetrates between these pillars 34, does not reach the free space 8.

The present invention is not limited to the examples described above. In particular, the metal electrical connection pillars and the protective metal barrier could be produced simultaneously on the chip including an electronic circuit, and the chip including a sensor could be placed on these pillars and this barrier. Other alternative embodiments are possible without departing from the scope of the invention.

The invention claimed is:

1. A method for fabricating at least one electronic device, comprising a first and a second integrated-circuit chip stacked on one another, the method comprising:
    simultaneously producing, on mounting zones of a mounting face of a first chip by growth or electrodeposition of at least one metal, a plurality of metal electrical connection pillars and at least one protective metal barrier surrounding a region of the mounting face;
    placing a second chip on the first chip such that a mounting face of the second chip faces the mounting face of the first chip and the metal electrical connection pillars and the protective metal barrier contact mounting zones of the second chip;
    soldering the metal electrical connection pillars and the protective metal barrier to the mounting zones of the second chip, so that the protective metal barrier delimits a leaktight free space between the first chip and the second chip; and
    applying a coating material around the first chip and on a periphery of the mounting face of the second chip, and curing the coating material so as to produce an encapsulation block;
    wherein the protective metal barrier is in a form of at least one open ring defining an opening into the region of the mounting face and at least one straight portion overlapping an end portion of the at least one open ring and the opening.

2. The method according to claim 1, comprising producing the encapsulation block so that the encapsulation block reaches the protective metal barrier.

3. The method according to claim 1, wherein the simultaneously producing step further comprises:
    forming a mask on the mounting face of the first chip;
    forming a plurality of through openings through the mask;
    producing the plurality of metal electrical connection pillars and the at least one protective metal barrier in the plurality of through openings;
    applying a soldering material to the electrical connection pillars and the at least one protective metal barrier; and
    removing the mask.

4. The method according to claim 1, wherein the at least one open ring is an open continuous ring.

5. The method according to claim 1, wherein the at least one open ring is a pair of C-shaped portions disposed open toward each other.

6. An electronic device, comprising:
    a first integrated-circuit chip stacked on a second integrated-circuit chip, the first integrated-circuit chip having a mounting face oriented toward and disposed a distance from a mounting face of the second integrated-circuit chip;
    a plurality of electrical connection pillars and at least one protective barrier interposed between and secured to the mounting faces of the first and second integrated-circuit chips, the at least one protective barrier delimiting a free space between mutually opposing local regions of the mounting faces;
    an encapsulation block extending around the first integrated-circuit chip and over a periphery of the mounting face of the second integrated-circuit chip; and
    wherein the electrical connection pillars and the protective barrier are made from at least one identical metallic material;
    wherein the protective barrier is in a form of at least one open ring defining an opening into the free space and at least one straight portion overlapping an end portion of the at least one open ring and the opening.

7. The electronic device according to claim 6, wherein one of the integrated-circuit chips comprises a sensor and the other integrated-circuit chip comprises an electronic circuit for processing a signal delivered by the sensor.

8. The electronic device according to claim 6, wherein the at least one open ring is an open continuous ring.

9. The electronic device according to claim 6, wherein the at least one open ring is a pair of C-shaped portions disposed open toward each other.

10. An electronic device, comprising:
    a first integrated-circuit chip;
    a second integrated-circuit chip stacked on the first integrated-circuit chip, the first integrated-circuit chip having a mounting face oriented toward and disposed a distance from a mounting face of the second integrated-circuit chip;
    a plurality of electrical connection pillars interposed between and secured to the mounting faces of the first and second integrated-circuit chips;
    at least one metallic protective barrier interposed between and secured to the mounting faces of the first and second integrated-circuit chips, the at least one metallic protective barrier delimiting a free space between the mounting face of the first integrated-circuit chip and the mounting face of the second integrated-circuit chip; and
    an encapsulation block extending around the first integrated-circuit chip and over a periphery of the mounting face of the second integrated-circuit chip;
    wherein the at least one metallic protective barrier is in a form of at least one open ring defining an opening into the free space and at least one straight portion overlapping an end portion of the at least one open ring and the opening.

11. The electronic device according to claim 10, further comprising a sensor on the first integrated-circuit chip, and an electronic circuit on the second integrated-circuit chip, the electronic circuit operable to process a signal from the sensor.

12. The electronic device according to claim 10, wherein the at least one open ring is an open continuous ring.

13. The electronic device according to claim 10, wherein the at least one open ring is a pair of C-shaped portions disposed open toward each other.

* * * * *